(12) United States Patent
Nemirovsky et al.

(10) Patent No.: US 10,811,556 B2
(45) Date of Patent: Oct. 20, 2020

(54) MULTI LAYERED THERMAL SENSOR

(71) Applicants: TODOS TECHNOLOGIES LTD., Airport City (IL); TECHNION RESEARCH AND DEVELOPEMENT FOUNDATION LTD., Haifa (IL)

(72) Inventors: Yael Nemirovsky, Haifa (IL); Amikam Nemirovsky, Haifa (IL)

(73) Assignees: TODOS TECHNOLOGIES LTD., Airport City (IL); TECHNION RESEARCH AND DEVELOPEMENT FOUNDATION LTD., Haifa (IL)

( * ) Notice: Subject to any disclaimer, the term of this patent is extended or adjusted under 35 U.S.C. 154(b) by 18 days.

(21) Appl. No.: 16/231,947

(22) Filed: Dec. 25, 2018

(65) Prior Publication Data
US 2019/0207053 A1 Jul. 4, 2019

Related U.S. Application Data

(60) Provisional application No. 62/610,946, filed on Dec. 28, 2017.

(51) Int. Cl.
*H01L 31/09* (2006.01)
*H01L 31/18* (2006.01)
*H01L 31/0232* (2014.01)
*H01L 31/0203* (2014.01)
*G01J 5/02* (2006.01)
*H01L 21/3065* (2006.01)
(Continued)

(52) U.S. Cl.
CPC .......... *H01L 31/1804* (2013.01); *G01J 5/023* (2013.01); *G01J 5/024* (2013.01); *G01J 5/0215* (2013.01); *G01J 5/045* (2013.01); *G01J 5/0806* (2013.01); *H01L 21/3065* (2013.01); *H01L 31/0203* (2013.01); *H01L 31/02327* (2013.01); *H01L 31/09* (2013.01); *G01J 2005/0077* (2013.01); *G01J 2005/202* (2013.01); *G01J 2005/204* (2013.01)

(58) Field of Classification Search
CPC .......... H01L 31/02327; H01L 21/3065; H01L 31/09; H01L 31/1804; G01J 5/024; G01J 2005/0077; G01J 2005/202; G01J 2005/204; G01J 5/02; G01J 5/0215; G01J 5/023; G01J 5/045; G01J 5/0806
See application file for complete search history.

(56) References Cited

U.S. PATENT DOCUMENTS

| | | | |
|---|---|---|---|
| 2006/0244067 A1* | 11/2006 | Socher | B81B 3/0062 257/350 |
| 2009/0108351 A1* | 4/2009 | Yang | H01L 29/7855 257/347 |
| 2011/0315880 A1* | 12/2011 | Nemirovsky | G01J 1/4228 250/340 |

* cited by examiner

*Primary Examiner* — David P Porta
*Assistant Examiner* — Fani Boosalis
(74) *Attorney, Agent, or Firm* — Reches Patent

(57) ABSTRACT

A method for manufacturing a thermal sensor, the method may include forming, using ion etching, one or more first holes that pass through (a) an initial layer, (a) a first oxide layer, (c) a first semiconductor substrate; filling the one or more first holes with oxide to form supporting elements; fabricating one or more thermal semiconductor sensing elements; forming one or more second holes in the one or more upper layers and the first oxide layer; applying an isotropic etching process to remove the first semiconductor substrate and expose the supporting elements to provide a suspended first oxide layer.

20 Claims, 14 Drawing Sheets

(51) Int. Cl.
*G01J 5/04*     (2006.01)
*G01J 5/08*     (2006.01)
 G01J 5/20      (2006.01)
 G01J 5/00      (2006.01)

MULTI LAYERED THERMAL SENSOR

CROSS REFERENCE

This application claims priority from U.S. provisional patent Ser. No. 62/610,946 filing date 28 Dec. 2018.

BACKGROUND

There is a growing need to provide smaller and more efficient sensors.

SUMMARY

There may be provide a method for manufacturing a thermal sensor, the method may include forming, using ion etching, one or more first holes that pass through (a) an initial layer, (a) a first oxide layer that may be positioned below the initial layer, (c) a first semiconductor substrate that may be positioned between first oxide layer and a second oxide layer; wherein the second oxide may be positioned above a second semiconductor substrate; filling the one or more first holes with oxide to form supporting elements; fabricating one or more thermal semiconductor sensing elements within one or more upper layers located about the first oxide layer, wherein the fabricating may include removing parts of the initial layer; forming one or more second holes in the one or more upper layers and the first oxide layer; and applying an isotropic etching process to remove the first semiconductor substrate and expose the supporting elements to provide a suspended first oxide layer that may be supported, at least in part, by the supporting elements; wherein the isotropic etching process may be silicon-selective, gas-based, and involves using the second oxide layer as an etch stop. Silicon selective means that the isotropic especially etches silicon and may not substantially etch other materials such as oxide. Gas based means that the etching can be done by a gas.

The applying of the isotropic etching process may include allowing an etching gas to reach the first semiconductor substrate through the one or more second holes.

The forming of the one or more holes may include forming multiple holes below multiple thermal semiconductor sensing elements.

The isotropic etching process may have a finer resolution than the ion etching process.

The isotropic etching process may be configured to etch higher aspect ratio holes than the ion etching process.

The isotropic etching process may involve using xenon fluoride.

The method may include forming one or more lenses that precede the one or more thermal semiconductor sensing elements, wherein the one or more lenses may be configured (constructed and arranged) to direct infrared radiation onto the one or more thermal semiconductor sensing elements.

The one more lenses may be larger than the one or more thermal semiconductor sensing elements.

There may be provided a thermal sensor that may include: one or more upper layers that may include one or more thermal semiconductor sensing elements; a first oxide layer that may be positioned below the one or more upper layer; a first oxide layer; a second oxide layer that may be spaced apart from the first oxide layer by a gap; supporting elements that may be made of oxide; wherein the supporting elements pass through holes formed in the first oxide layer, may be supported by the second oxide layer and pass through the gap; a second semiconductor substrate that may be positioned below the second oxide layer.

The thermal sensor may be manufactured by a process the may include removing a first semiconductor substrate that was positioned in the gap by applying an isotropic etching process; wherein the isotropic etching process may be silicon-selective, gas-based, and involves using the second oxide layer as an etch stop.

The applying of the isotropic etching process may include allowing an etching gas to reach the first semiconductor substrate through the one or more second holes formed in the one or more upper layers and the first oxide layer.

The thermal sensor may include one or more lenses that precede the one or more thermal semiconductor sensing elements, wherein the one or more lenses may be configured to direct infrared radiation onto the one or more thermal semiconductor sensing elements.

The one more lenses may be larger than the one or more thermal semiconductor sensing elements. This may increase the form factor of the thermal sensor. Form factor may mean the ratio between the sensing area and the overall area of the thermal sensor.

The lenses may be silicon lenses.

The lenses may be non-silicon lenses.

The one or more thermal semiconductor sensing elements may be multiple thermal semiconductor sensing elements, and wherein the supporting elements may be formed below the multiple thermal semiconductor sensing elements.

The thermal semiconductor sensing elements may be coupled to one or more frames.

The thermal sensor may include a wafer level packaging cap and a wafer level packaging bottom that maintain the one or more thermal semiconductor sensing elements within a vacuumed environment.

There may be provided a method for thermal sensing, the method may include: sensing infrared radiation by one or more one or more thermal semiconductor sensing elements of a thermal sensor to generate detection signals; and reading the detection signals by a readout circuit of the thermal sensor; wherein the thermal sensor further may include one or more upper layers that may include the one or more thermal semiconductor sensing elements; a first oxide layer that may be positioned below the one or more upper layer; a first oxide layer; a second oxide layer that may be spaced apart from the first oxide layer by a gap; supporting elements that may be made of oxide, wherein the supporting elements pass through holes formed in the first oxide layer, may be supported by the second oxide layer and pass through the gap; and a second semiconductor substrate that may be positioned below the second oxide layer.

The method may include directing the infrared radiation by one or more lenses formed in a wafer level packaging cap of the thermal sensor.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

Figure 1:
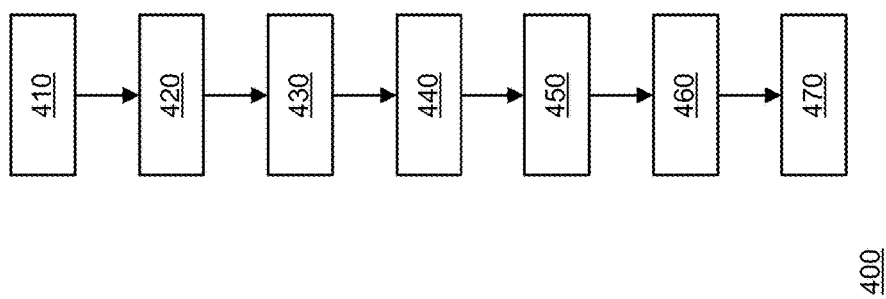
FIG. 1 illustrates an example of a method.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Any reference in the specification to a system should be applied mutatis mutandis to a method that can be executed by the system.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Thermally isolated Metal Oxide Semiconductor (TMOS) transistors may be suspended—they may be coupled to holding elements that maintain the TMOS transistors thermally isolated from a micromachined bulk.

There is a growing need to provide compact arrays of thermal sensors that can be included in thermal cameras such as infrared cameras. Compact arrays may allow better spatial resolution and are cheaper—due to their smaller footprint.

The size of the thermal transistors has to be of an order of the wavelength of the detected radiation—for example the detection of infrared requires thermal transistors in the order of about 8-14 by 8-14 microns. For example—thermal transistors of about 10-15 by 10-15 microns may be provided.

Such compact thermal transistors may be manufactured using wafer level processing and packaging—which reduces the cost of manufacturing.

When a TMOS transistor is scaled down in dimensions (by a certain factor) it still has to be thermally isolated—and the effective length of the holding element should not be decreased by that factor. In order to a provide holding element of a certain length while decreasing the overall area allocated to the holding element—the holding element should be narrowed—in order to provide a higher density pattern of the holding element.

The narrowing may require a highly accurate etching process. The highly accurate etching process may involve using xenon fluoride (XeF2) which is highly selective to silicon. An etching process that uses XeF2 is isotropic—and is does not suffer from limited aspect ratio (as other anisotropic processes).

Time based control of the isotropic nature of the XeF2 etching process is not accurate when etching large objects—as the propagation of the XeF2 may dramatically differ from one location to the other—especially when etching large wafers (6, 8 inch or larger).

Accordingly—controlling the XeF2 etching process based to time is inefficient. In order to control the XeF2 etching process there is provided a wafer that includes multiple layers for forming the TMOS transistors and the holding elements (the multiple layers include a first isolating layer (BOX1)—first oxide layer—on top of a first semiconductor substrate—such as a first silicon layer (Si1)), as well as a second isolating layer (BOX2)—second oxide layer—on top of a second semiconductor substrate such as a second silicon layer (Si2). The second isolating layer is used as a mask—(a built-in etch stop layer) that limits the propagation of the XeF2—and prevents it from etching the second silicon layer. Accordingly—the XeF2 etching process is now controlled by the mask—and the duration of the XeF2 etching process should be long enough to allow the XeF2 to reach the second isolating layer—throughout the wafer.

The shrinking the TMOS transistors may not be followed by the same shrink of the holding elements—and the form factor of the TMOS array (known as Fill Factor) may be decreased. In order to compensate for this decrement of the array of TMOS transistors may be preceded by optics—such as an array of microlenses that will direct radiation from areas that exceeds the area of the TMOS transistors onto the TMOS transistors.

It should be noted that the TMOS is merely one example of a thermally sensitive sensing element. The TMOS may be replaced by other sensing elements such as a BiCMOS transistor or any other non-transistor sensing element.

The sensor array may be coupled to a readout circuit. The sensor array and the readout circuit may be included in the same die or on different dies. When implemented on different dies the readout circuit may be implements on a die that does not include the second isolation layer—which is more cost effective.

FIG. 1 illustrates an example of manufacturing method 400 for manufacturing a thermal sensor.

Figure 3:
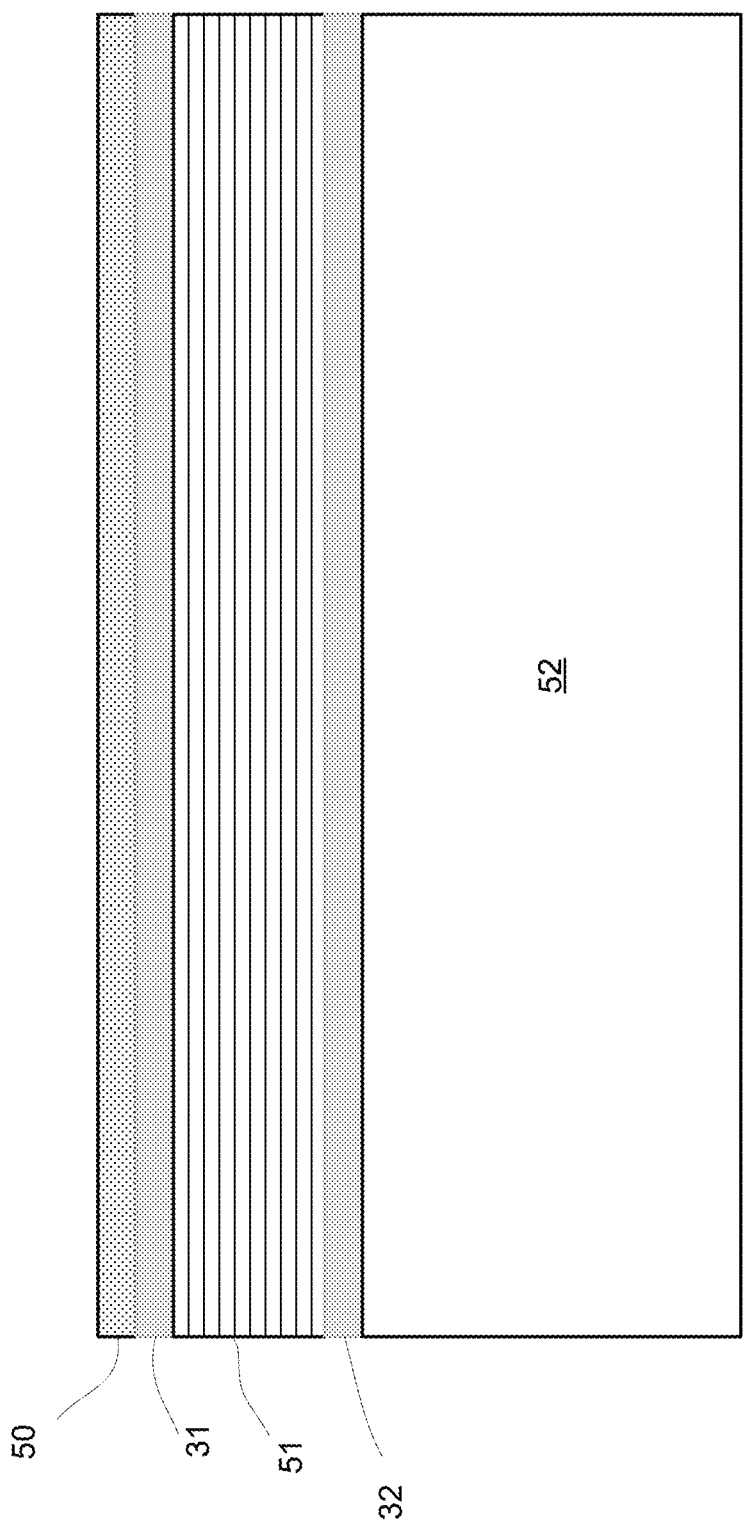
FIG. 3-8 illustrate an example of various manufacturing steps.

Method 400 may start by step 410 of receiving a double silicon on oxide wafer. The double silicon on oxide wafer includes (see FIG. 3)—from top to bottom: an initial layer 50, first oxide layer 31, first semiconductor substrate 51, second oxide layer 32, second semiconductor substrate 52.

Figure 4:
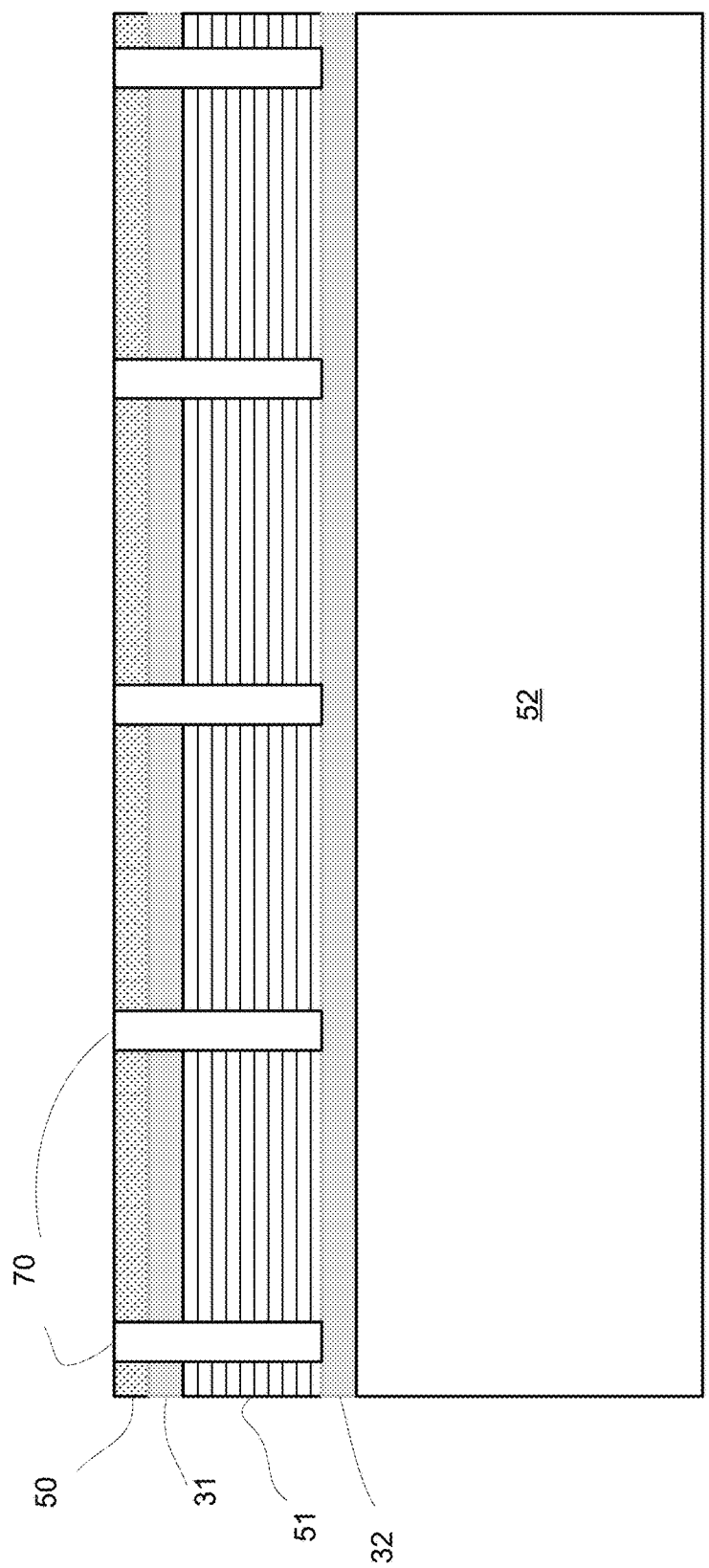

Step 410 may be followed by step 420 of forming, using ion etching (for example reactive ion etching), one or more first holes 70 that pass through initial layer 50, first oxide layer 31 and first semiconductor substrate 51. The first holes 70 end at the second oxide layer 32. See, for example FIG. 4.

Figure 5:
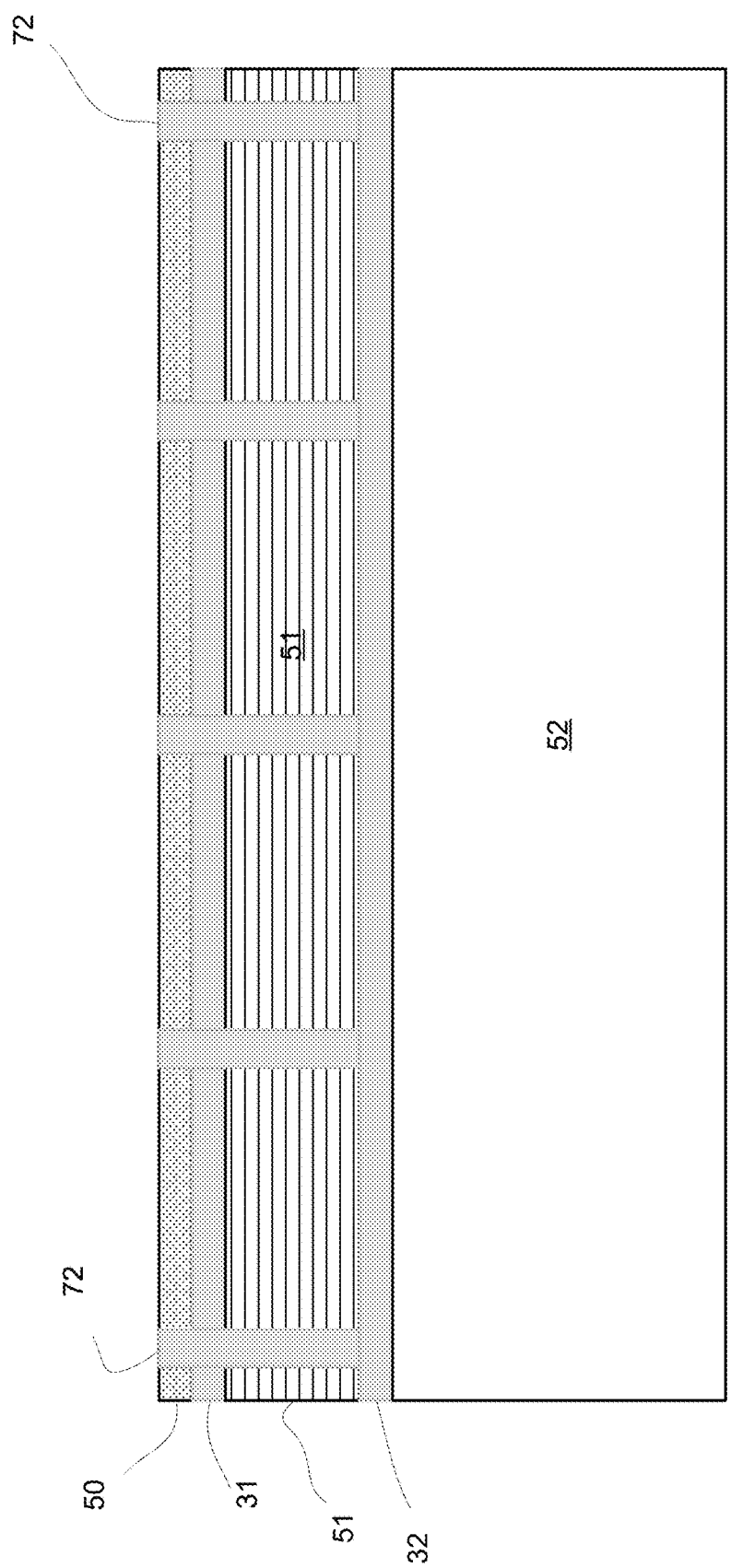

Step 420 may be followed by step 430 of filling the one or more first holes with oxide to form supporting elements 72. See, for example FIG. 5.

Step 430 may be followed by step 440 of fabricating one or more thermal semiconductor sensing elements within one or more upper layers located about the first oxide layer, wherein the fabricating comprises removing parts of the initial layer. See, for example FIG. 6—one or more upper layers 21, 22, 23 and 24 in which multiple thermal semiconductor sensing elements 61, 62, 63 and 64 are formed.

Figure 6:
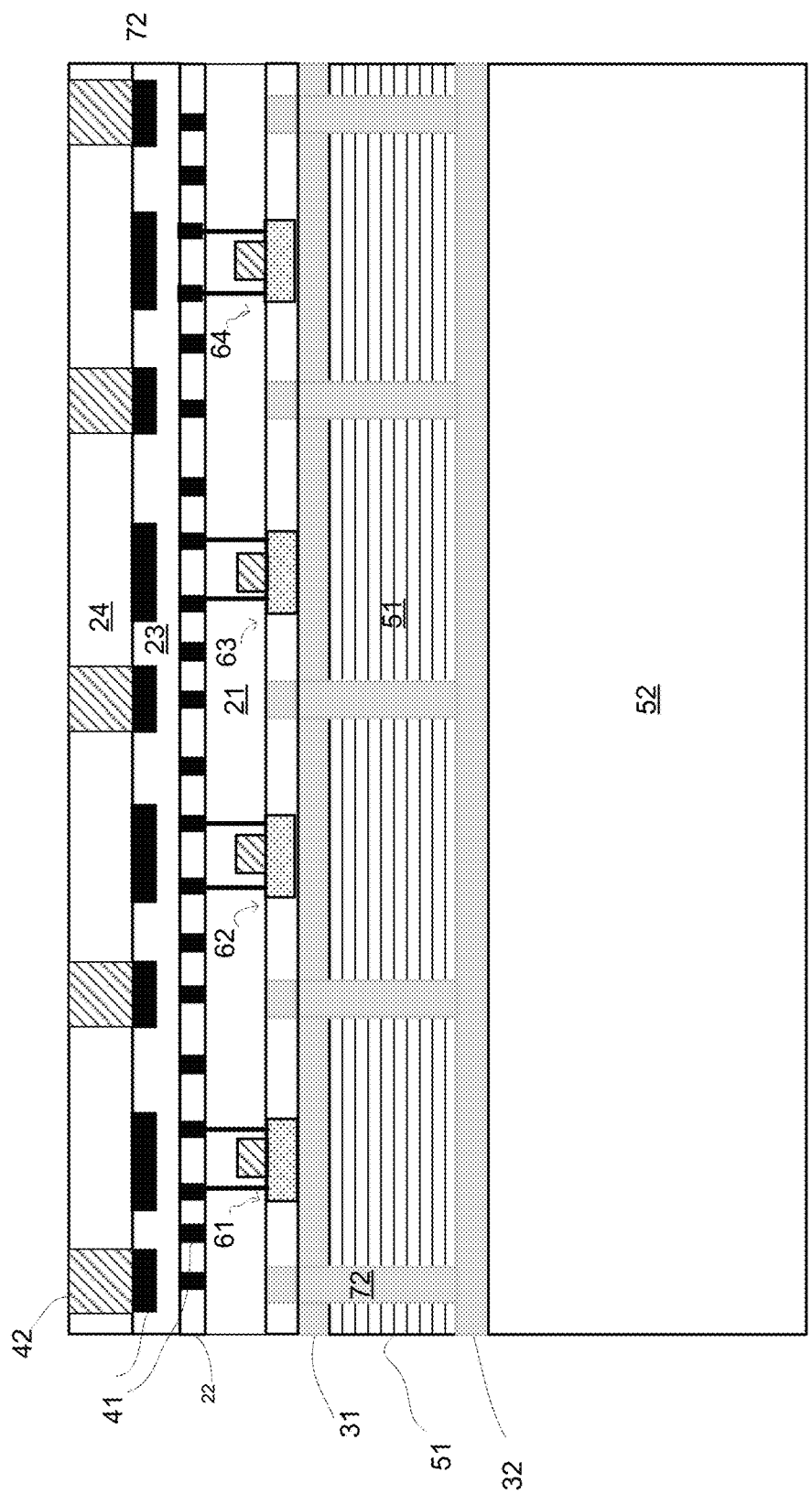

FIG. 6 also illustrates photoresist or other mask elements 42 and various metal elements that will be coupled to terminals of the multiple thermal semiconductor sensing elements 61, 62, 63 and 64, some will be included in frames and/or arms and some may be used as masks. It should be noted that each thermal semiconductor sensing elements may be coupled to electrodes made of semiconductor material (for example two electrodes per thermal semiconductor sensing element)—that may pass through the arms and coupled the thermal semiconductor sensing elements to a readout circuit.

Figure 7:
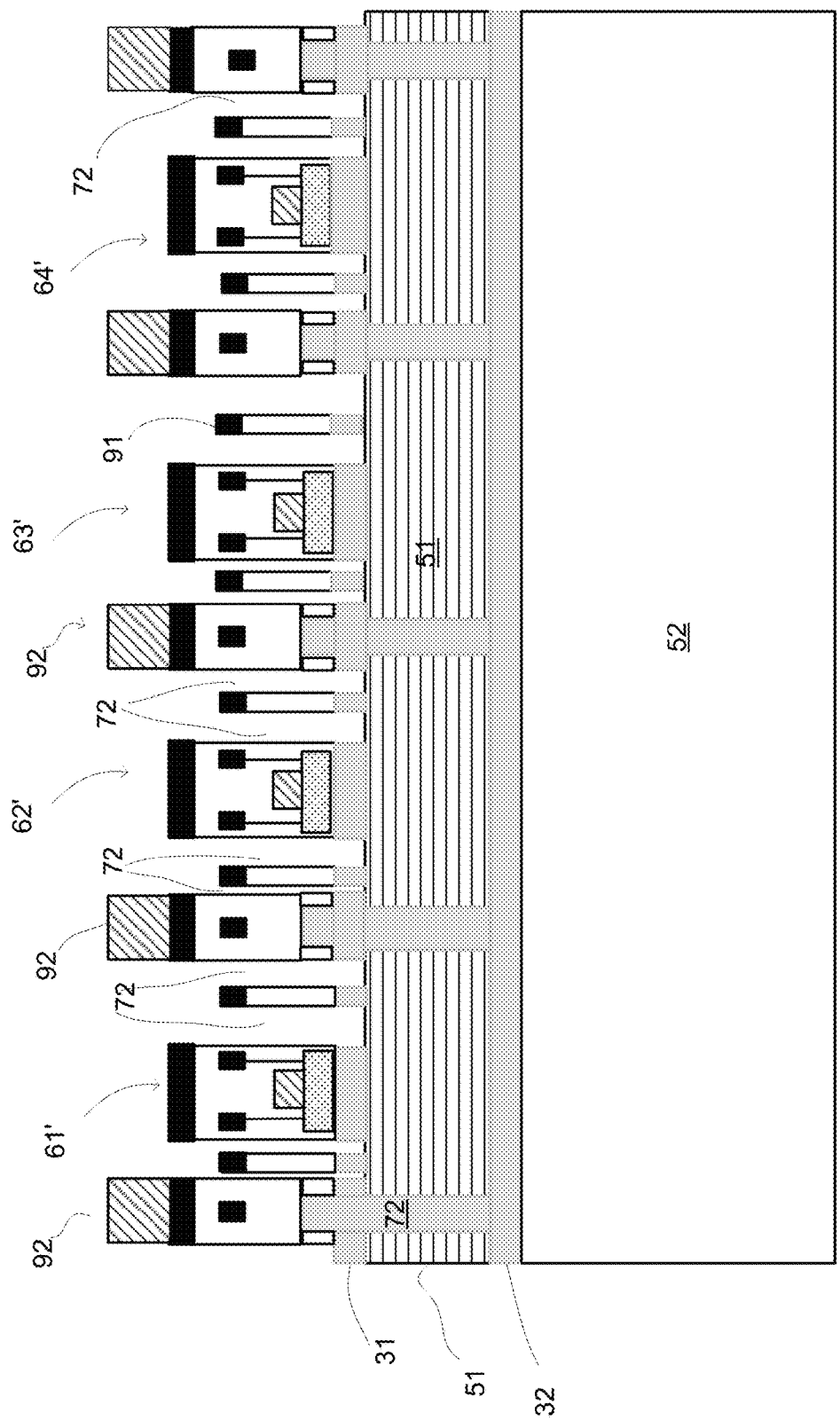

Step 440 may be followed by step 450 of forming one or more second holes 74 in the one or more upper layers and the first oxide layer 31. See, for example, FIG. 7. This step may include or may be preceded by ion etching to separate the arms from the regions that include the thermal semiconductor sensing elements.

Figure 8:
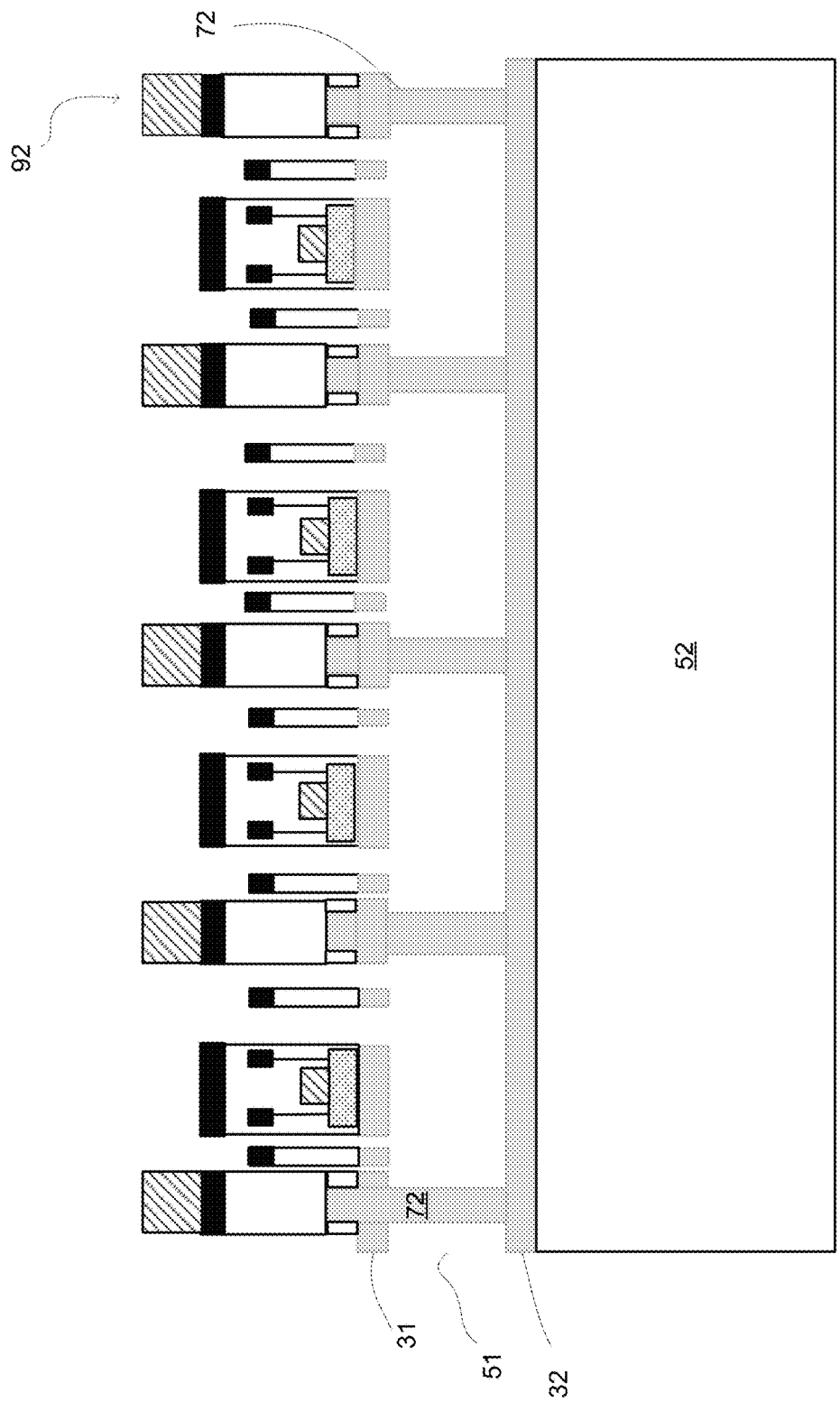

Step 450 may be followed by step 460 of applying an isotropic etching process to remove the first semiconductor substrate and expose the supporting elements to provide a suspended first oxide layer that is supported, at least in part, by the supporting elements; wherein the isotropic etching process is silicon-selective, gas-based, and involves using the second oxide layer as an etch stop. See, for example FIG. 8 in which there is no first semiconductor substrate.

Step 460 may include allowing an etching gas to reach the first semiconductor substrate through the one or more second holes.

The isotropic etching process may have a finer resolution than the ion etching process.

The isotropic etching process may be configured to etch higher aspect ratio holes than the ion etching process.

The isotropic etching process may involve using xenon fluoride.

The manufacturing process may include additional steps such as

Step 460 may be followed by step 470 of performing an additional manufacturing process step.

Step 470 may include wafer level packaging the thermal semiconductor sensing elements and maintaining the thermal semiconductor sensing elements in a vacuumed environment.

Step 470 may include one or more lenses that precede the one or more thermal semiconductor sensing elements. The one or more lenses are configured to direct infrared radiation onto the one or more thermal semiconductor sensing elements. The one or more lenses may increase the fill factor of the semiconductor sensor—by being larger than the one or more thermal semiconductor sensing elements.

Figure 9:
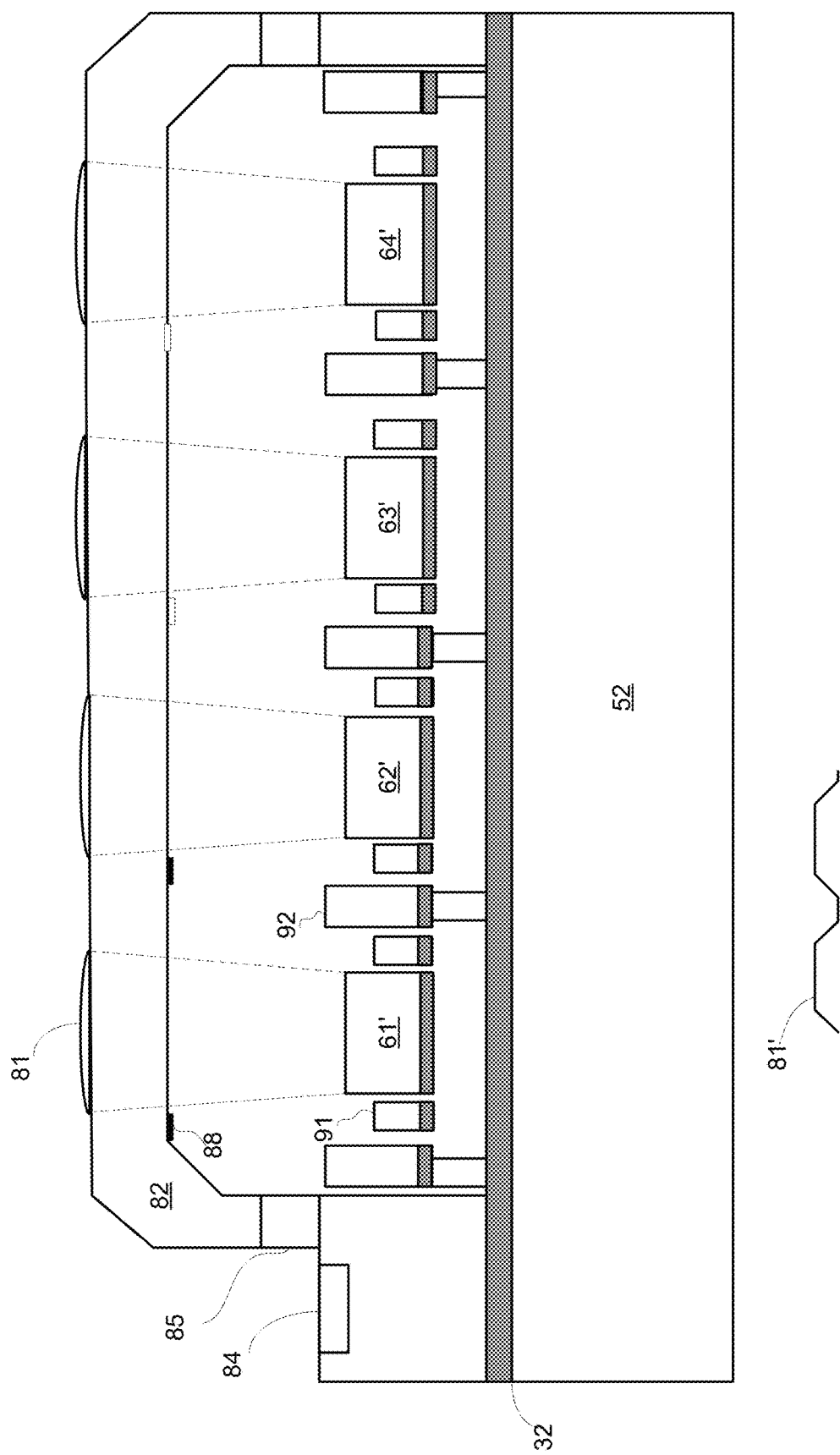
FIG. 9 illustrates a wafer level package thermal sensor.

FIG. 9 illustrates a cross section of a wafer level package thermal sensor.

FIG. 9 illustrates a cap 82. Pads 84 located outside the inner space formed by the cap and the second semiconductor substrate 52, microlenses 81 formed on top of the cap (although another form of microlenses is shown on the bottom of the figure), glass frit 85 for bonding the second oxide layer 32 to the cap (other attachment layers or elements may be provided), getter 88 that may distributed in various manner within the inner space to maintain a vacuumed environment), frame 92, arms and regions 61', 62', 63' and 64' that include (each) one or more thermal semiconductor sensing elements.

Figure 10:
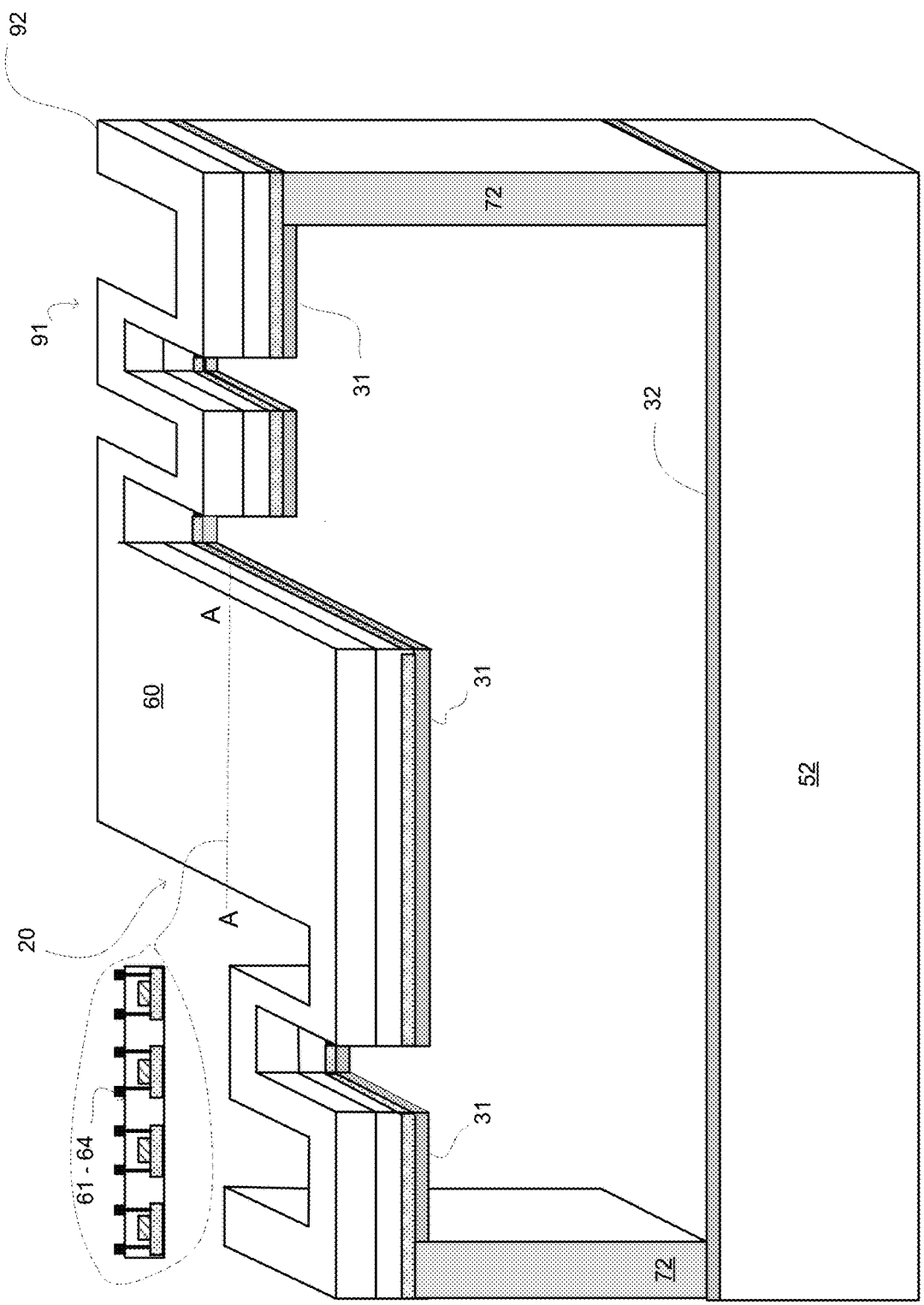
FIGS. 10-14 illustrate various parts of a thermal sensor.

FIG. 10 illustrates a box shaped region that includes multiple thermal semiconductor sensing elements—such as thermal semiconductor sensing elements 61, 62, 63 and 64 positioned along an imaginary axis A-A. Arms 92 support the region from the right rear part of the region and from the left front part of the region. There may be any other spatial relationship between the region and the arms. The arms are supported by supporting elements 72 that in turn are supported by second oxide layer 32.

Figure 11:
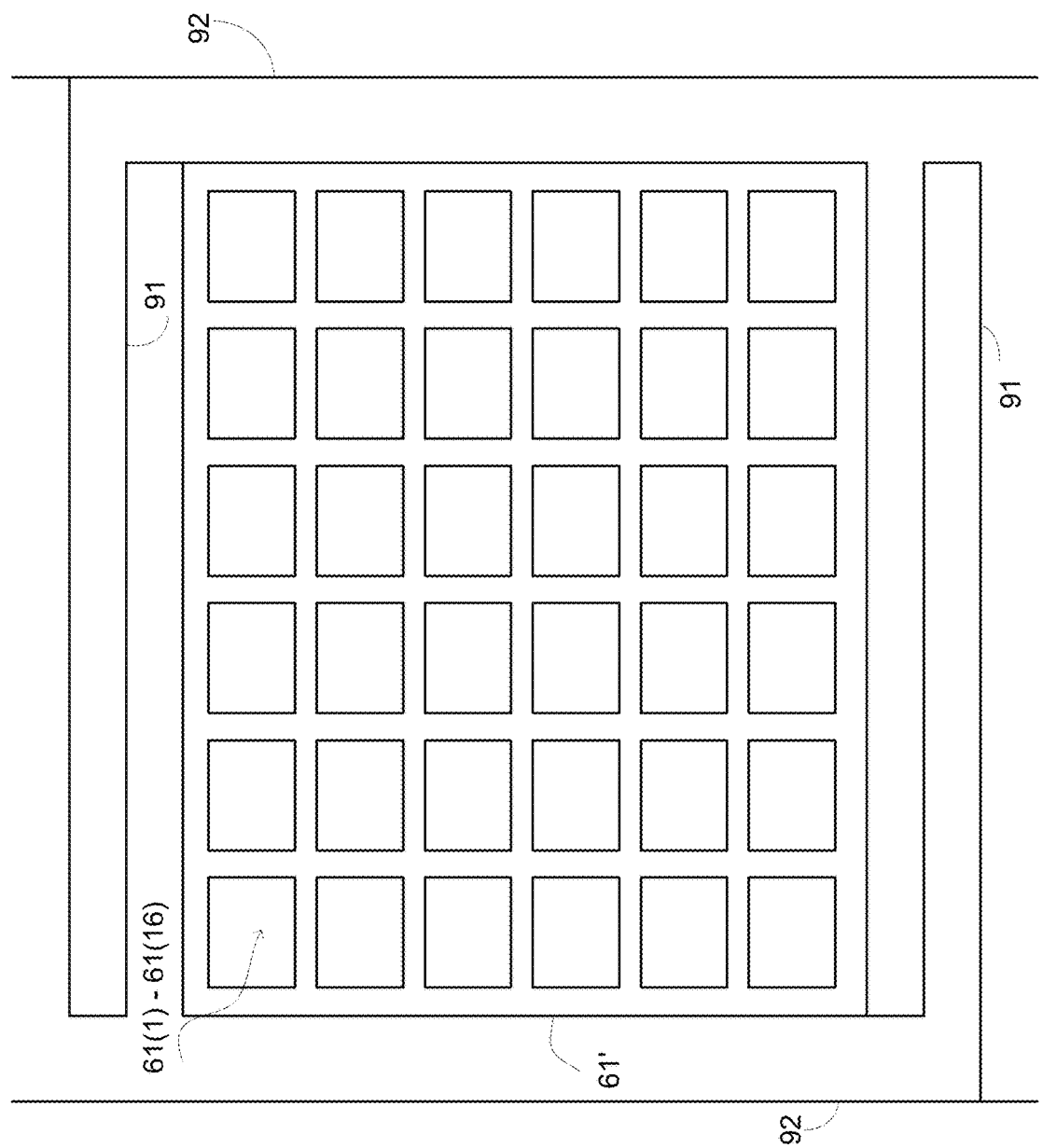

FIG. 11 illustrates an array of thermal semiconductor sensing elements 61(1)-61(16) that are coupled in parallel to each other to form a single pixel 61. The pixel 61 is supported by arms 91 that are connected to frame 92.

Figure 12:
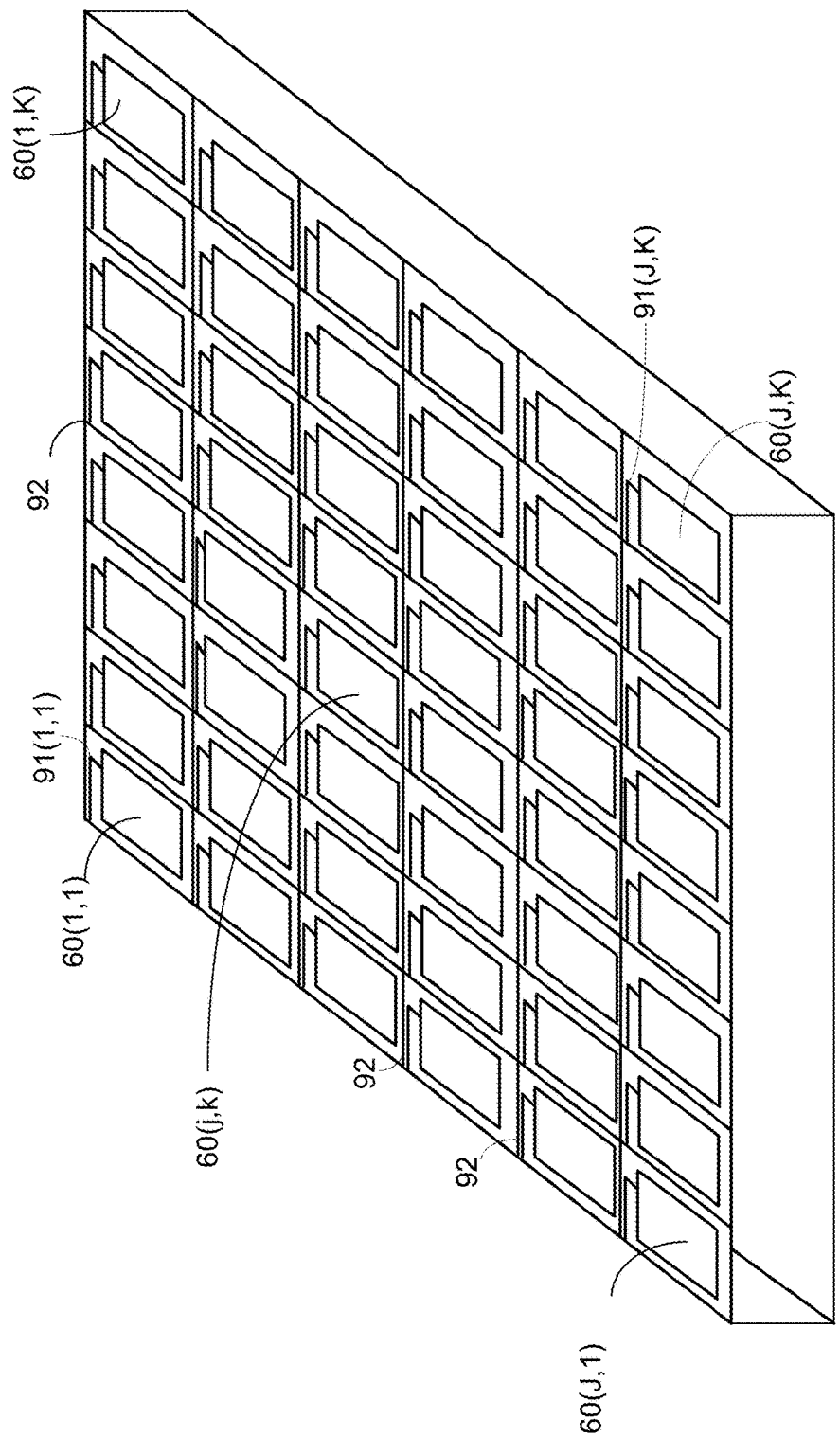

FIG. 12 illustrates an array of pixels 60(1,1)-60(J,K) that are supported by an array of arms pixels 91(1,1)-91(J,K) that are supported by frame 92.

Figure 13:
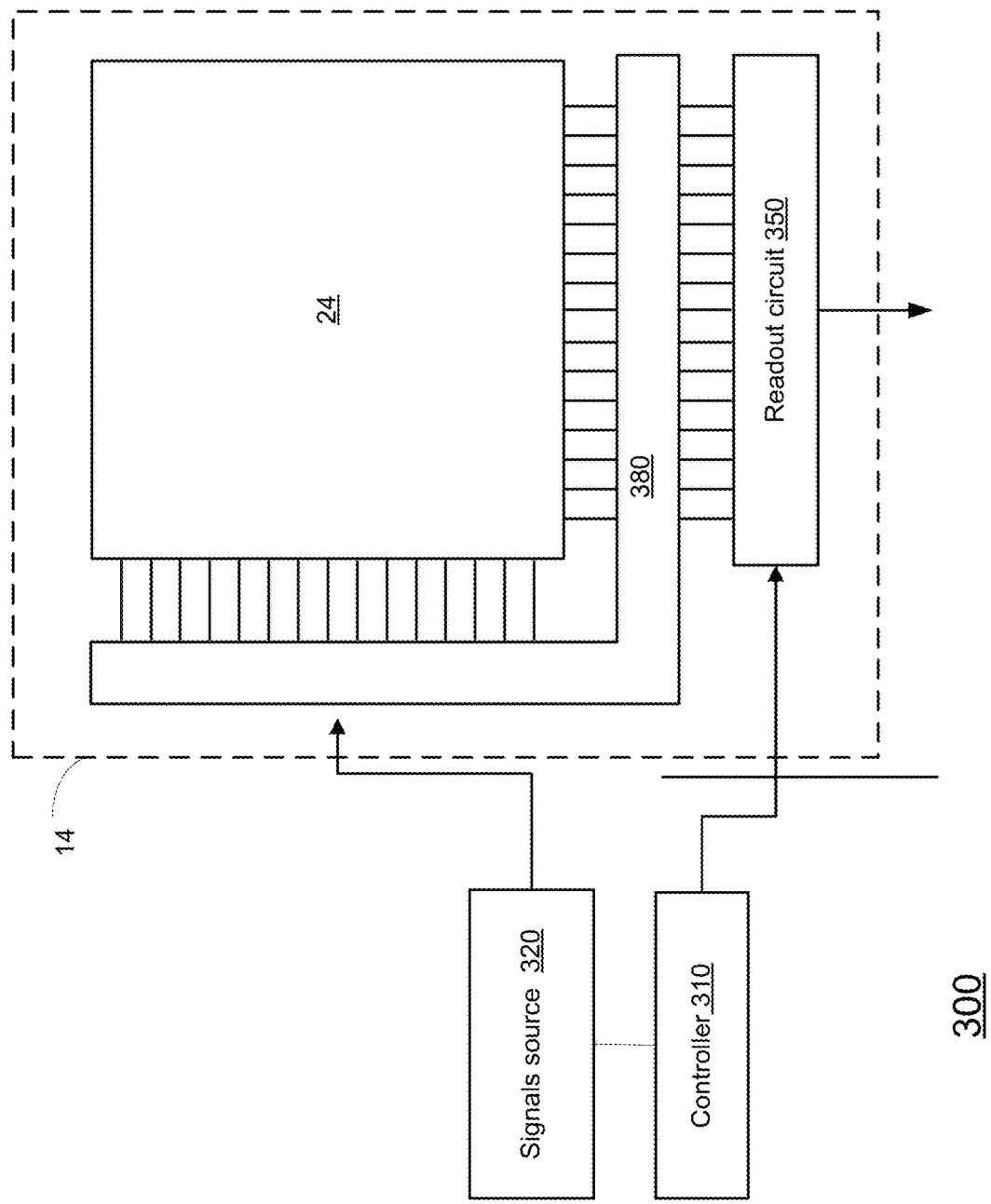
Figures 4B, 14:
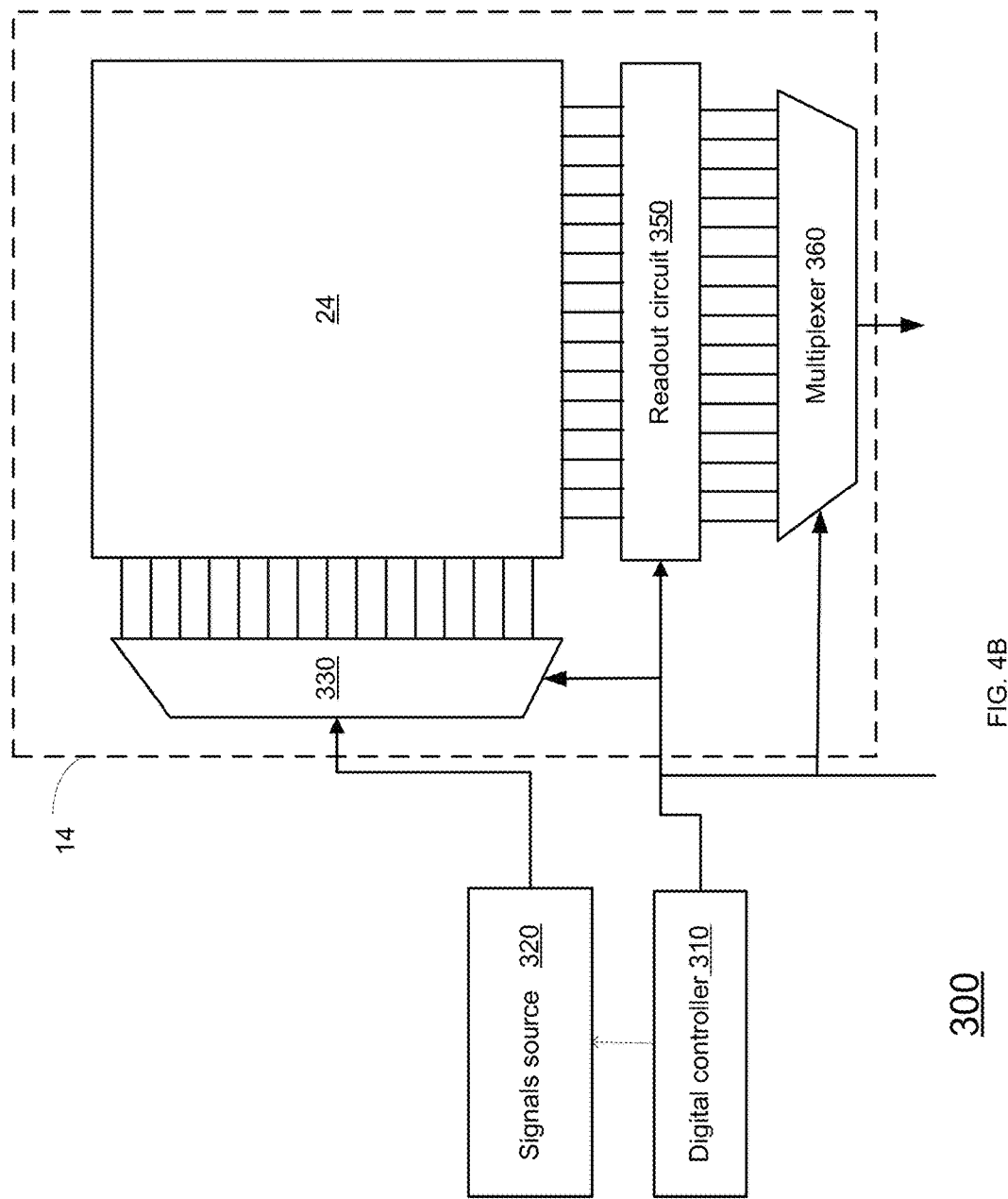

FIGS. 13 and 14 illustrates example of a thermal sensor that includes, in addition to the array 124 of pixels, a controller 310, signals source 320, interfacing module 380, and readout circuit 350. I Although interfacing module 380 is illustrated as a separate entity from the array 124, both array 124 and interfacing module 380 may be integrated and may form a part of the wafer level package sensor.

Interfacing module 380 may couple between the array 124 to the signals source 320 and to the readout circuit 350.

Readout circuit 350 may read detection signals from one or more semiconductor thermal sensing elements at a time. For example—the readout circuit 350 may read a single row of array 24, a part of a row, more than a single row, a column, a part of a column, more than a column and even the entire array at once.

Readout circuit 350 may read current detection signals, voltage detection signals, differential detection signals and the like.

Readout circuit 350 may send bias electrical signals and/or may read the response (signals outputted from) the one or more semiconductor thermal sensing elements and may either process the response to determine the detected radiation or may send the measurements to another device (not shown) that will determine the detected radiation.

Thermal sensing device 300 may include reference sensing elements. The reference sensing elements may be included in array 124 or outside array 124.

According to an embodiment of the invention the interfacing module 380 may also electrically couple between different semiconductor thermal sensing elements of the array 124. The interfacing module 380 may couple certain semiconductor thermal sensing elements of the array in serial to each other during one measurement and couple the certain semiconductor thermal sensing elements of the array in parallel to each other during another measurement. Any combination of serial and parallel couplings between semiconductor thermal sensing elements may be provided. The interfacing module 380 may include any combination of switches, interconnects and the like.

Signals source 310 is configured to supply bias signals to at least one semiconductor thermal sensing element of the array 124. The bias signals may include voltage bias signals and/or current bias signals. Some bias signals may set one or more semiconductor temperature sensing elements to one or more desired working points.

Controller 310 is configured to control the operation of the thermal sensor 300.

Controller 310, signals source 320, interfacing module 380, readout circuit 350 and array 124 of semiconductor thermal sensing elements may be formed on the same chip.

FIG. 14 illustrates a thermal sensing device 300 according to an embodiment of the invention.

In FIG. 4B the interfacing module 380 is illustrated as including (i) a de-multiplexer 330 that is coupled between signals source 320 and array 124, and (ii) a multiplexer 360 that is coupled between readout circuit 350 and an output port of thermal sensor.

Any number of pixels may be included in the array 124.

The array 124 may include dummy pixels that do not sense the radiation sensed by the non-dummy pixels. The dummy pixels may be arranged in a different array.

The pixels of the array include built-in optical cavities.

Figure 2:
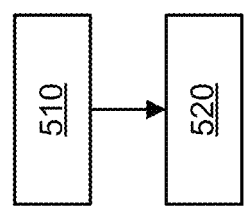
FIG. 2 illustrates an example of a method.

FIG. 2 illustrates method 500.

Method 500 may include step 510 of sensing infrared radiation by one or more one or more thermal semiconductor sensing elements of a thermal sensor to generate detection signals.

Step 520 may be followed by step 520 of reading the detection signals by a readout circuit of the thermal sensor.

The thermal sensor may be any of the thermal sensors illustrated in this application.

Any reference to any of the terms "comprise", "comprises", "comprising" "including", "may include" and "includes" may be applied to any of the terms "consists", "consisting", "consisting essentially of".

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "rear" "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between various components are merely illustrative and that alternative embodiments may merge various components or impose an alternate decomposition of functionality upon various components. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" Each other such that the desired functionality is achieved, irrespective of architectures or intermedial components. Likewise, any two components so associated can also be viewed as being "operably connected," or "operably coupled," to Each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for manufacturing a thermal sensor, the method comprises:
    forming, using ion etching, one or more first holes that pass through (a) an initial layer, (b) a first oxide layer that is positioned below the initial layer, (c) a first semiconductor substrate that is positioned between first oxide layer and a second oxide layer; wherein the second oxide is positioned above a second semiconductor substrate;
    filling the one or more first holes with oxide to form supporting elements;
    fabricating one or more thermal semiconductor sensing elements within one or more upper layers located about the first oxide layer, wherein the fabricating comprises removing parts of the initial layer;
    forming one or more second holes in the one or more upper layers and the first oxide layer;
    applying an isotropic etching process to remove the first semiconductor substrate and expose the supporting elements to provide a suspended first oxide layer that is supported, at least in part, by the supporting elements wherein the isotropic etching process is silicon-selective, gas-based, and involves using the second oxide layer as an etch stop.

2. The method according to claim 1 wherein the applying of the isotropic etching process comprises allowing an etching gas to reach the first semiconductor substrate through the one or more second holes.

3. The method according to claim 1 wherein the forming of the one or more holes comprises forming multiple holes below multiple thermal semiconductor sensing elements.

4. The method according to claim 1 wherein the isotropic etching process has a finer resolution than the ion etching process.

5. The method according to claim 1 wherein the isotropic etching process is configured to etch higher aspect ratio holes than the ion etching process.

6. The method according to claim 1 wherein the isotropic etching process involve using xenon fluoride.

7. The method according to claim 1 comprising forming one or more lenses that precede the one or more thermal semiconductor sensing elements, wherein the one or more lenses are configured to direct infrared radiation onto the one or more thermal semiconductor sensing elements.

8. The method according to claim 7 wherein the one more lenses are larger than the one or more thermal semiconductor sensing elements.

9. A thermal sensor, that comprises: one or more upper layers that comprise one or more thermal semiconductor sensing elements; a first oxide layer that is positioned below the one or more upper layer; a first oxide layer; a second oxide layer that is spaced apart from the first oxide layer by a gap; supporting elements that are made of oxide; wherein the supporting elements pass through holes formed in the first oxide layer, are supported by the second oxide layer and pass through the gap; a second semiconductor substrate that is positioned below the second oxide layer.

10. The thermal sensor according to claim 9 that was manufactured by a process the comprises: removing a first semiconductor substrate that was positioned in the gap by applying an isotropic etching process; wherein the isotropic etching process is silicon-selective, gas-based, and involves using the second oxide layer as an etch stop.

11. The thermal sensor according to claim 9 wherein the applying of the isotropic etching process comprises allowing an etching gas to reach the first semiconductor substrate through the one or more second holes formed in the one or more upper layers and the first oxide layer.

12. The thermal sensor according to claim 9 comprising one or more lenses that precede the one or more thermal semiconductor sensing elements, wherein the one or more lenses are configured to direct infrared radiation onto the one or more thermal semiconductor sensing elements.

13. The thermal sensor according to claim 12 wherein the one more lenses are larger than the one or more thermal semiconductor sensing elements.

14. The thermal sensor according to claim 9 wherein the lenses are silicon lenses.

15. The thermal sensor according to claim 9 wherein the lenses are non-silicon lenses.

16. The thermal sensor according to claim 9 wherein the one or more thermal semiconductor sensing elements are multiple thermal semiconductor sensing elements, and wherein the supporting elements are formed below the multiple thermal semiconductor sensing elements.

17. The thermal sensor according to claim 9 wherein the one or more thermal semiconductor sensing elements, and wherein the thermal semiconductor sensing elements are coupled to one or more frames.

18. The thermal sensor according to claim 9 comprising a wafer level packaging cap and a wafer level packaging bottom that maintain the one or more thermal semiconductor sensing elements within a vacuumed environment.

19. A method for thermal sensing, the method comprises: sensing infrared radiation by one or more one or more thermal semiconductor sensing elements of a thermal sensor to generate detection signals; and reading the detection signals by a readout circuit of the thermal sensor; wherein the thermal sensor further comprises one or more upper layers that comprise the one or more thermal semiconductor sensing elements; a first oxide layer that is positioned below the one or more upper layer; a first oxide layer; a second oxide layer that is spaced apart from the first oxide layer by a gap; supporting elements that are made of oxide, wherein the supporting elements pass through holes formed in the first oxide layer, are supported by the second oxide layer and pass through the gap; and a second semiconductor substrate that is positioned below the second oxide layer.

20. The method according to claim 19 comprising directing the infrared radiation by one or more lenses formed in a wafer level packaging cap of the thermal sensor.

* * * * *